United States Patent
Li et al.

(10) Patent No.: US 11,016,546 B2
(45) Date of Patent: May 25, 2021

(54) HEAT DISSIPATION APPARATUS AND TERMINAL DEVICE HAVING SAME

(71) Applicant: Huawei Technologies Co., Ltd., Shenzhen (CN)

(72) Inventors: Wei Li, Dongguan (CN); Chunyang Chen, Dongguan (CN); Baochun Chen, Shenzhen (CN); Zhiguo Zhang, Wuhan (CN); Quanming Li, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/473,838

(22) PCT Filed: Dec. 29, 2016

(86) PCT No.: PCT/CN2016/113152
§ 371 (c)(1),
(2) Date: Jun. 26, 2019

(87) PCT Pub. No.: WO2018/119925
PCT Pub. Date: Jul. 5, 2018

(65) Prior Publication Data
US 2020/0150732 A1   May 14, 2020

(51) Int. Cl.
*H05K 7/20* (2006.01)
*G06F 1/20* (2006.01)
(Continued)

(52) U.S. Cl.
CPC ............. *G06F 1/206* (2013.01); *F28D 20/02* (2013.01); *H04M 1/026* (2013.01); *H05K 7/2039* (2013.01)

(58) Field of Classification Search
None
See application file for complete search history.

(56) References Cited

U.S. PATENT DOCUMENTS 5,007,478 A * 4/1991 Sengupta .............. F28D 20/023
165/10
6,317,321 B1 * 11/2001 Fitch ...................... F28D 20/02
165/104.33
(Continued)

FOREIGN PATENT DOCUMENTS

| CN | 1573651 A | 2/2005 |
|---|---|---|
| CN | 1856236 A | 11/2006 |

(Continued)

OTHER PUBLICATIONS

Foreign Communication From a Counterpart Application, European Application No. 16924972.9, Extended European Search Report dated Jan. 3, 2020, 8 pages.
(Continued)

*Primary Examiner* — Courtney L Smith
(74) *Attorney, Agent, or Firm* — Conley Rose, P.C.

(57) ABSTRACT

A heat dissipation apparatus applied to a terminal device includes a phase change material (PCM) and a heat transfer unit. The heat transfer unit is in contact with the PCM to conduct heat of the terminal device to the PCM. Because the PCM maintains a temperature substantially unchanged during a phase change, a temperature of the heat dissipation apparatus is not excessively high while heat is absorbed.

17 Claims, 9 Drawing Sheets

(51) Int. Cl.
*F28D 20/02* (2006.01)
*H04M 1/02* (2006.01)

(56) References Cited

U.S. PATENT DOCUMENTS

| | | | |
|---|---|---|---|
| 7,324,340 | B2 | 1/2008 | Xiong |
| 9,313,875 | B2* | 4/2016 | Wikander ............ G06F 1/1656 |
| 9,836,100 | B2* | 12/2017 | Han ...................... G03B 17/55 |
| 2004/0244397 | A1 | 12/2004 | Kim |
| 2004/0252454 | A1 | 12/2004 | Chen |
| 2005/0280987 | A1* | 12/2005 | Kwitek ................. G06F 1/203 |
| | | | 361/679.54 |
| 2010/0002381 | A1 | 1/2010 | Min et al. |
| 2010/0126708 | A1 | 5/2010 | Mikami |
| 2012/0307453 | A1 | 12/2012 | Yan et al. |
| 2014/0118928 | A1 | 5/2014 | Cheng et al. |
| 2014/0118943 | A1 | 5/2014 | Cheng et al. |
| 2014/0118948 | A1 | 5/2014 | Cheng et al. |
| 2014/0317389 | A1 | 10/2014 | Wenisch et al. |
| 2014/0340841 | A1 | 11/2014 | Yu et al. |
| 2015/0075186 | A1* | 3/2015 | Prajapati ................ F25B 21/02 |
| | | | 62/3.7 |
| 2015/0276321 | A1 | 10/2015 | Huang |
| 2016/0021786 | A1 | 1/2016 | Hata |
| 2016/0169591 | A1 | 6/2016 | Thiagarajan et al. |
| 2016/0212841 | A1* | 7/2016 | Hartmann ............. H01L 23/42 |
| 2017/0155746 | A1* | 6/2017 | Yang .................. H05K 7/20509 |
| 2018/0076112 | A1* | 3/2018 | Dabral ................... H01L 23/28 |

FOREIGN PATENT DOCUMENTS

| | | |
|---|---|---|
| CN | 1953163 A | 4/2007 |
| CN | 101621908 A | 1/2010 |
| CN | 101647330 A | 2/2010 |
| CN | 201590985 U | 9/2010 |
| CN | 102811589 A | 12/2012 |
| CN | 102954416 A | 3/2013 |
| CN | 203501872 U | 3/2014 |
| CN | 103796478 A | 5/2014 |
| CN | 103796486 A | 5/2014 |
| CN | 203896662 U | 10/2014 |
| CN | 204014396 U | 12/2014 |
| CN | 104506686 A | 4/2015 |
| CN | 104902041 A | 9/2015 |
| CN | 204906952 U | 12/2015 |
| CN | 205106687 U | 3/2016 |
| CN | 105455366 A | 4/2016 |
| CN | 105470222 A | 4/2016 |
| CN | 105472950 A | 4/2016 |
| CN | 105702641 A | 6/2016 |
| CN | 105828570 A | 8/2016 |
| CN | 205585516 U | 9/2016 |
| CN | 106052452 A | 10/2016 |
| CN | 106102415 A | 11/2016 |
| DE | 102014115290 A1 | 10/2015 |
| EP | 2378390 A2 | 10/2011 |
| JP | 2002057262 A | 2/2002 |
| JP | 2003218299 A | 7/2003 |
| JP | 2011039836 A | 2/2011 |
| JP | 2012109451 A | 6/2012 |
| JP | 2015032696 A | 2/2015 |
| JP | 2015137848 A | 7/2015 |
| JP | 2016024575 A | 2/2016 |
| KR | 20150047758 A | 5/2015 |
| TW | I316127 B | 10/2009 |
| WO | 2008126444 A1 | 10/2008 |

OTHER PUBLICATIONS

Foreign Communication From a Counterpart Application, Chinese Application No. 201780049688.4, Chinese Office Action dated Dec. 16, 2019, 25 pages.
Machine Translation and Abstract of Chinese Publication No. CN1953163, Apr. 25, 2007, 8 pages.
Machine Translation and Abstract of Chinese Publication No. CN102954416, Mar. 6, 2013, 5 pages.
Machine Translation and Abstract of Chinese Publication No. CN104506686, Apr. 8, 2015, 4 pages.
Machine Translation and Abstract of Chinese Publication No. CN104902041, Sep. 9, 2015, 10 pages.
Machine Translation and Abstract of Chinese Publication No. CN105455366, Apr. 6, 2016, 17 pages.
Machine Translation and Abstract of Chinese Publication No. CN105702641, Jun. 22, 2016, 8 pages.
Machine Translation and Abstract of Chinese Publication No. CN106052452, Oct. 26, 2016, 10 pages.
Machine Translation and Abstract of Chinese Publication No. CN201590985, Sep. 22, 2010, 7 pages.
Machine Translation and Abstract of Chinese Publication No. CN203501872, Mar. 26, 2014, 7 pages.
Machine Translation and Abstract of Chinese Publication No. CN204014396, Dec. 10, 2014, 10 pages.
Machine Translation and Abstract of Chinese Publication No. CN204906952, Dec. 23, 2015, 6 pages.
Machine Translation and Abstract of Chinese Publication No. CN205106687, Mar. 30, 2016, 5 pages.
Machine Translation and Abstract of Japanese Publication No. JP2003218299, Jul. 31, 2003, 9 pages.
Foreign Communication From a Counterpart Application, PCT Application No. PCT/CN2016/113152, English Translation of International Search Report dated Sep. 30, 2017, 2 pages.
Foreign Communication From a Counterpart Application, PCT Application No. PCT/CN2016/113152, English Translation of Written Opinion dated Sep. 30, 2017, 5 pages.
Foreign Communication From a Counterpart Application, PCT Application No. PCT/CN2017/114025, English Translation of International Search Report dated Mar. 5, 2018, 2 pages.
Foreign Communication From a Counterpart Application, PCT Application No. PCT/CN2017/114025, English Translation of Written Opinion dated Mar. 5, 2018, 4 pages.

* cited by examiner

HEAT DISSIPATION APPARATUS AND TERMINAL DEVICE HAVING SAME

CROSS-REFERENCE TO RELATED APPLICATIONS

This application is a U.S. National Stage of International Patent Application No. PCT/CN2016/113152 files on Dec. 29, 2016, which is hereby incorporated by reference in its entirety.

TECHNICAL FIELD

Embodiments of the present invention relate to a heat dissipation apparatus, and in particular, to a heat dissipation apparatus applied to a terminal device.

BACKGROUND

Terminal devices such as tablet computers and notebook computers are required to be light and portable, and deliver high performance and good temperature experience. Therefore, heat dissipation performance of a product is becoming increasingly important.

In the current terminal field, to improve performance of tablet computer and notebook products, power consumption of a CPU or GPU chip is usually controlled dynamically, and operating power consumption is dynamically adjusted based on a program running requirement and a product temperature. For example, when some large programs or documents are started, instantaneous overclocking is used to greatly increase operating power consumption in a short time, to achieve higher performance, shorten a program starting time, and enhance user experience. Such a transient scenario imposes a higher requirement on heat dissipation, but currently the industry lacks an effective solution, and performance improvement of terminals is restricted.

SUMMARY

In view of this, embodiments of the present invention provide a heat dissipation apparatus to effectively deal with a heat dissipation requirement brought by a short-time power consumption increase of a terminal device.

According to a first aspect, an embodiment of the present invention provides a heat dissipation apparatus applied to a terminal device, including a phase change material (PCM. Phase Change Material) and a heat transfer unit, where the heat transfer unit is in contact with the phase change material to conduct heat of the terminal device to the phase change material. Because the phase change material maintains a temperature substantially unchanged during a phase change, a temperature of the heat dissipation apparatus is not excessively high while heat is absorbed, thereby providing good user experience. For a terminal product in which a processor can dynamically adjust operating power consumption, the heat dissipation apparatus provided in this embodiment of the present invention can extend a time for which the processor can work in a high power consumption mode.

In a possible implementation, the heat transfer unit is in contact with a processor of the terminal device to conduct heat of the processor to the phase change material. The processor is usually a main heat source of the terminal device. Direct contact between the heat transfer unit and the processor can improve heat dissipation efficiency of the heat dissipation apparatus.

In a possible implementation, the phase change material has a predetermined phase change point and a predetermined heat capacity to absorb heat generated by the terminal device and maintain a temperature of the phase change material below the phase change point.

In a possible implementation, the heat transfer unit has a heat dissipation structure, configured to: dissipate heat to an external environment, to improve a heat dissipation effect; and when the processor works in a low power consumption mode, accelerate dissipation of heat absorbed by the phase change material.

In a possible implementation, a phase change point of the phase change material ranges from 10° C. to 70° C., so that the phase change material can be used in a normal living environment of a user.

Further, the phase change point of the phase change material ranges from 30° C. to 45° C. to balance a heat capacity and a temperature.

In a possible implementation, a heat capacity of the phase change material ranges from 100 joules to 10000 joules, to balance the heat capacity and an occupied volume.

In a possible implementation, the heat capacity of the phase change material ranges from 1 g to 200 g, to balance the heat capacity and the occupied volume.

In a possible implementation, the phase change material includes a solid-solid phase change material or a solid-liquid phase change material. A volume changes little during a phase change, facilitating production and installation.

In another possible implementation, the phase change material includes a solid-gas phase change material or a liquid-gas phase change material, and has a housing of sufficient strength to keep a shape and a volume of the phase change material substantially unchanged during a phase change.

In a possible implementation, the phase change material may include a composite phase change material.

Further, in a possible implementation, a form of the composite phase change material includes a microcapsule, a shaped phase change material, a nanocomposite phase change material, or a porous composite phase change material.

In a possible implementation, the phase change material and the heat transfer unit are connected through bonding or mechanical fastening to prevent falling-off in use.

In a possible implementation, the heat transfer unit is made from one or more of metal or non-metal materials to improve heat dissipation efficiency.

In a possible implementation, the phase change material covers the entire heat transfer unit, so that a thickness of the phase change material can be reduced and an interior of the terminal device becomes more compact.

In a possible implementation, the heat dissipation apparatus further includes a temperature equalizing unit. The temperature equalizing unit is disposed between the phase change material and the heat transfer unit, and is configured to conduct heat on the heat transfer unit more evenly to the phase change material to improve heat dissipation efficiency.

In a possible implementation, the heat transfer unit is provided with a groove matching a shape of the temperature equalizing unit, and the temperature equalizing unit is disposed in the groove to reduce a thickness of the heat dissipation apparatus.

In a possible implementation, the temperature equalizing unit may be a heat pipe or a VC.

In a possible implementation, the phase change material has a gap matching a shape of the temperature equalizing unit, and the temperature equalizing unit is disposed in the gap, to improve efficiency of the heat dissipation apparatus without increasing a thickness of the heat dissipation apparatus.

In a possible implementation, the phase change material has a protective film to maintain a shape of the phase change material and provide protection for the phase change material during production.

In a possible implementation, the protective film may be an organic thin-film such as PET or PI, or a metal thin-film. Further, a thickness is approximately 5% to 15% of a total thickness, and may be adjusted based on a requirement.

In a possible implementation, there is a cavity inside the heat transfer unit, and the phase change material is embedded in the cavity of the heat transfer unit.

According to another aspect, an embodiment of the present invention provides a terminal device, including a processor, a housing, and a phase change material. The processor disposed inside the housing may be configured to dynamically adjust a working mode. The phase change material in contact with the housing is configured to absorb heat of the terminal device. In this implementation, a structure of the terminal device such as a tablet computer or a mobile phone becomes more compact, and application of the phase change material can directly lower an outer surface temperature of the tablet computer or mobile phone product without changing an existing heat dissipation structure.

In a possible implementation, the phase change material is disposed on an inner surface or an outer surface of the housing; alternatively, there is a cavity in a wall of the housing, and the phase change material is disposed in the cavity.

In a possible implementation, the terminal device further includes a temperature equalizing unit. The temperature equalizing unit is disposed on the inner surface or the outer surface of the housing, or in the cavity of the housing, and is in contact with the phase change material.

In a possible implementation, an air layer is further disposed between the phase change material and the processor to first equalize heat dissipated by the processor.

According to another aspect, an embodiment of the present invention provides a terminal device having the foregoing heat dissipation apparatus. The terminal device may be a mobile phone, a tablet computer, a notebook computer, a desktop computer, an in-vehicle device, a television, a set-top box, a VR device, or the like.

According to still another aspect, an embodiment of the present invention provides a terminal device having the foregoing heat dissipation apparatus. The terminal device includes a computing chip and the heat dissipation apparatus. The computing chip dynamically adjusts operating power consumption. The heat dissipation apparatus has a predetermined heat capacity to absorb heat of the terminal device and extend a time for which the computing chip can work in a high power consumption mode.

The foregoing implementations may be randomly combined to achieve different implementation effects.

The foregoing solutions in the embodiments of the present invention can deal with a short-time power consumption increase of the terminal device, effectively dissipate heat while controlling the outer surface temperature of the terminal device to be not excessively high or reducing an outer surface temperature rising speed of the terminal device, thereby providing good user experience.

DESCRIPTION OF EMBODIMENTS

Figure 1:
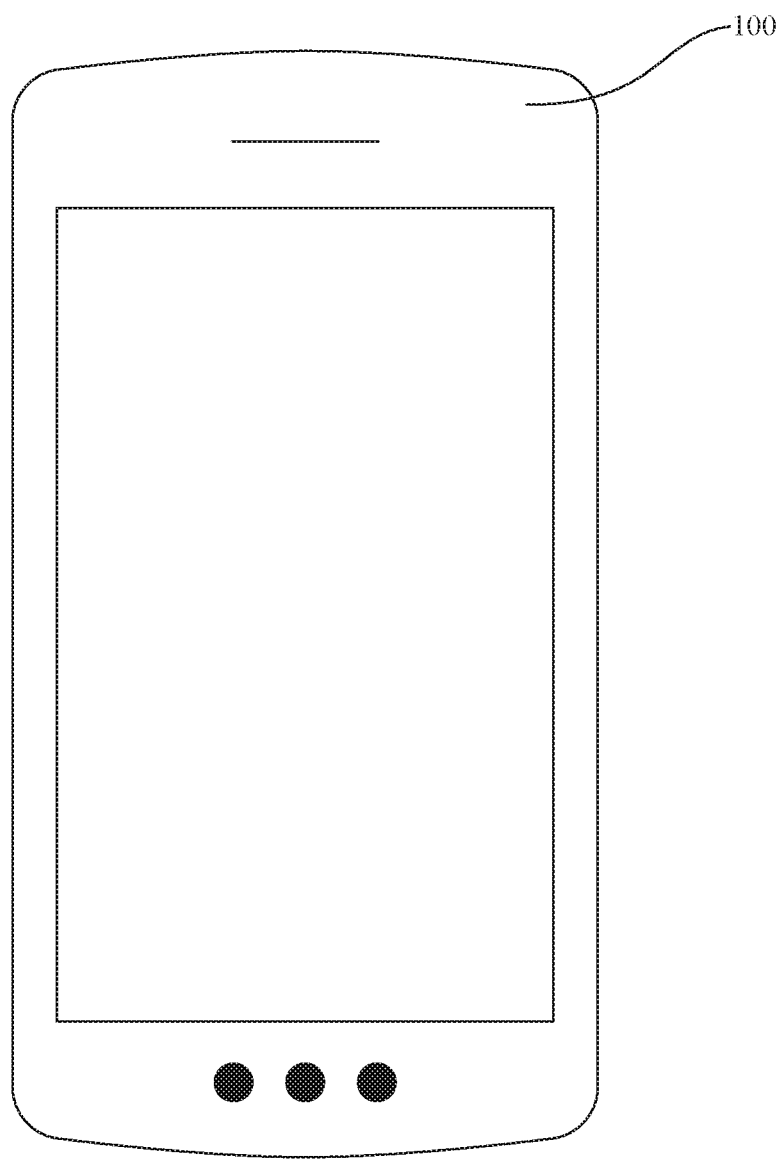
FIG. 1 is a schematic diagram of a terminal device according to a possible implementation of the present invention.

FIG. 1 is a schematic diagram of a terminal device according to a possible implementation of the present invention.

The terminal device 100 in an embodiment of the present invention may include a mobile phone, a tablet computer, a PDA (Personal Digital Assistant, personal digital assistant), a POS (Point of Sales, point of sale), an in-vehicle computer, and the like.

Figure 2:
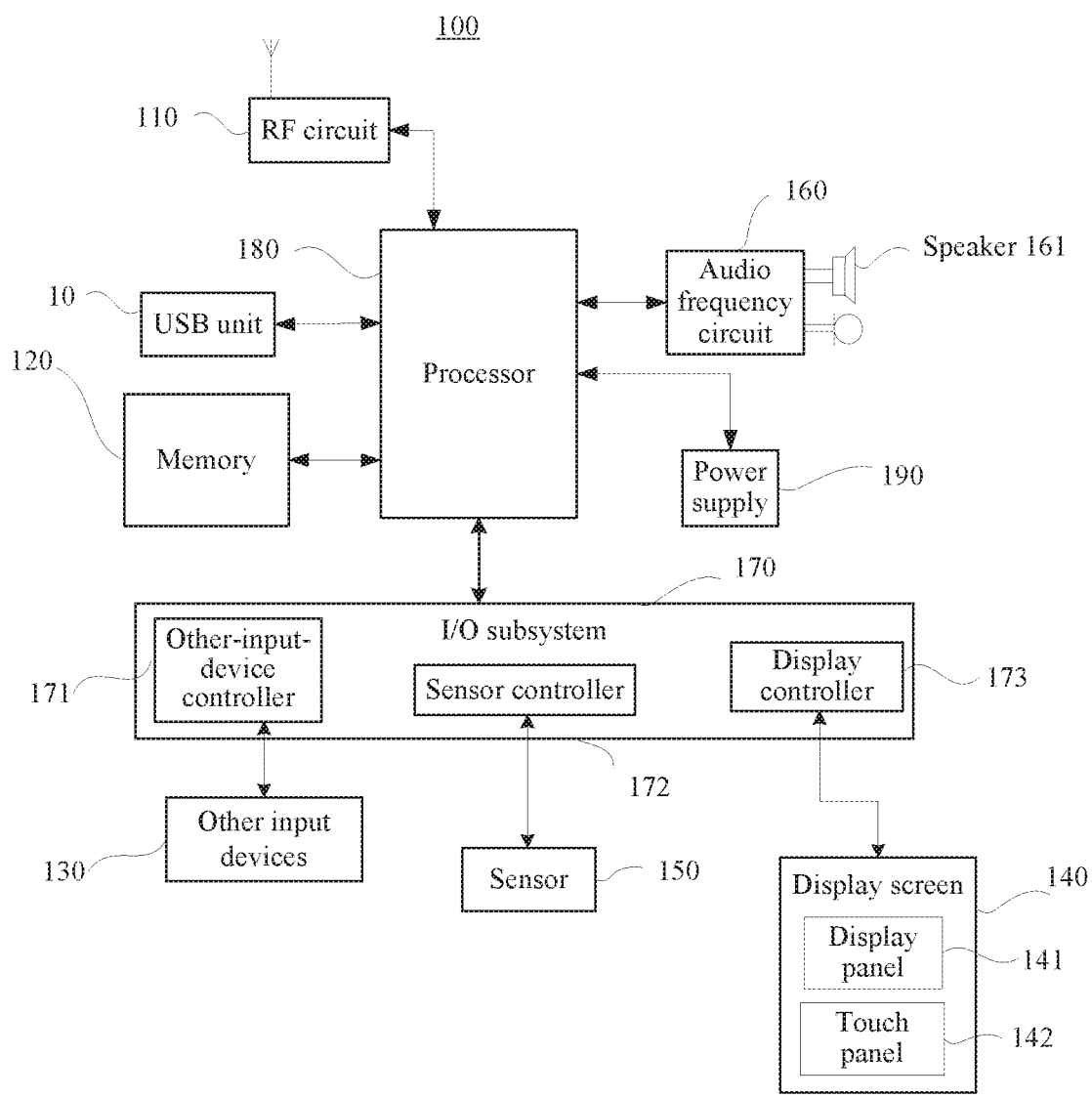
FIG. 2 is a block diagram of a partial structure of a terminal device according to a possible implementation of the present invention.

For example, the terminal device 100 is a mobile phone. FIG. 2 is a block diagram of a partial structure of the mobile phone 100 according to this embodiment of the present invention. Referring to FIG. 2, the mobile phone 100 includes components such as an RF (Radio Frequency, radio frequency) circuit 110, a memory 120, other input devices 130, a display screen 140, a sensor 150, an audio frequency circuit 160, an I/O subsystem 170, a processor 180, and a power supply 190. A person skilled in the art may understand that the mobile phone structure shown in FIG. 2 does not constitute any limitation on the mobile phone, and the mobile phone may include components more or fewer than those shown in the figure, or in the mobile phone, some components are combined, some components are separated, or the components are disposed differently. A person skilled in the art may understand that the display screen 140 belongs to a user interface (UI, User Interface), and the mobile phone 100 may include user interfaces shown in the figure or fewer user interfaces than those shown in the figure.

With reference to FIG. 2, the following specifically describes the components of the mobile phone 100.

The RF circuit 110 may be configured to receive and send information, or receive and send signals during a call, and particularly, receive downlink information from a base station, and then send the downlink information to the processor 180 for processing. In addition, the RF circuit 110 sends related uplink data to the base station. Generally, the RF circuit includes but is not limited to an antenna, at least one amplifier, a transceiver, a coupler, an LNA (Low Noise Amplifier, low noise amplifier), a duplexer, and the like. In addition, the RF circuit 110 may also communicate with a network and another device through radio communication. The radio communication may be implemented by using any communication standard or protocol, including but not limited to GSM (Global System of Mobile communication, Global System for Mobile Communications), GPRS (General Packet Radio Service, general packet radio service), CDMA (Code Division Multiple Access, Code Division Multiple Access), WCDMA (Wideband Code Division Multiple Access, Wideband Code Division Multiple Access), LTE (Long Term Evolution, Long Term Evolution), email, SMS (Short Messaging Service, short message service), and the like.

The memory 120 may be configured to store a software program and a module. The processor 180 executes various functional applications of the mobile phone 100 and processes data by running the software program and the module stored in the memory 120. The memory 120 may mainly include a program storage area and a data storage area. The program storage area may store an operating system, an application program required for at least one function (such as a sound playback function or an image playback function), and the like. The data storage area may store data (such as audio data and a phone book) and the like created based on use of the mobile phone 100. In addition, the memory 120 may include a high-speed random access memory, or may include a non-volatile memory such as at least one magnetic disk storage device, a flash memory device, or another volatile solid-state memory device.

The other input devices 130 may be configured to receive input numeral or character information, and generate key signal input related to a user setting and function control of the mobile phone 100. Specifically, the other input devices 130 may include but are not limited to one or more of a physical keyboard, a function key (such as a volume control key or an on/off key), a trackball, a mouse, a joystick, and an optical mouse (the optical mouse is an extension of a touch-sensitive surface that does not display a visual output, or an extension of a touch-sensitive surface formed by a touchscreen). The other input devices 130 are connected to an other-input-device controller 171 of the I/O subsystem 170, and perform a signal interaction with the processor 180 under control of the other-input-device controller 171.

The display screen 140 may be configured to display information input by a user or information provided to the user and various menus of the mobile phone 100, and may also receive user input. Specifically, the display screen 140 may include a display panel 141 and a touch panel 142. The display panel 141 may be configured in a form of an LCD (Liquid Crystal Display, liquid crystal display), an OLED (Organic Light-Emitting Diode, organic light-emitting diode), or the like. The touch panel 142 is also referred to as a touchscreen, a touch-sensitive screen, or the like, and may collect a touch operation or a non-touch operation (such as an operation performed by the user on the touch panel 142 or near the touch panel 142 by using a finger, a stylus, or any suitable object or accessory, or a somatosensory operation; the operation includes a single-point control operation, a multi-point control operation, and other types of operations) of the user on or near the touch panel 142, and drive a corresponding connected apparatus according to a preset program. Optionally, the touch panel 142 may include two parts: a touch detection apparatus and a touch controller. The touch detection apparatus detects a touch location and a posture of the user, detects a signal brought by a touch operation, and transmits the signal to the touch controller. The touch controller receives touch information from the touch detection apparatus, converts the touch information into information that can be processed by the processor, and sends the information to the processor 180, and can receive a command sent by the processor 180 and execute the command. In addition, the touch panel 142 may be implemented in various types such as a resistive type, a capacitive type, an infrared type, and a surface acoustic wave type, or the touch panel 142 may be implemented by using any technology developed in the future. Further, the touch panel 142 may cover the display panel 141. The user may perform, based on content displayed on the display panel 141 (the displayed content includes but is not limited to a soft keyboard, a virtual mouse, a virtual key, an icon, and the like), an operation on or near the touch panel 142 that covers the display panel 141. After detecting a touch operation on or near the touch panel 142, the touch panel 142 transfers the touch operation to the processor 180 by using the I/O subsystem 170, to determine a type of a touch event to determine a user input. Then, the processor 180 provides, by using the I/O subsystem 170, a corresponding visual output on the display panel 141 based on the type of the touch event and the user input. In FIG. 2, the touch panel 142 and the display panel 141 act as two independent components to implement input and output functions of the mobile phone 100. However, in some embodiments, the touch panel 142 and the display panel 141 may be integrated to implement the input and output functions of the mobile phone 100.

The mobile phone 100 may further include at least one sensor 150, such as a light sensor, a motion sensor, and another sensor. Specifically, the light sensor may include an ambient light sensor and a proximity sensor. The ambient light sensor may adjust luminance of the display panel 141 based on brightness of ambient light. The proximity sensor may turn off the display panel 141 and/or backlight when the mobile phone 100 moves to an ear. As a type of motion sensor, an accelerometer sensor may detect acceleration magnitudes in all directions (usually three axes) of the mobile phone, can detect a magnitude and a direction of gravity when the mobile phone is in a static state, and can be applied to an application recognizing a mobile phone posture (such as screen switching between a portrait mode and a landscape mode, a related game, and magnetometer posture calibration), a function related to vibration recognition (such as a pedometer or a knock), and the like. For another sensor that may also be configured in the mobile phone 100, such as a gyroscope, a barometer, a hygrometer, a thermometer, or an infrared sensor, details are not described herein.

The audio frequency circuit 160, a speaker 161, and a microphone 162 may provide an audio interface between the user and the mobile phone 100. The audio frequency circuit 160 may transmit, to the speaker 161, a signal converted from received audio data. The speaker 161 converts the signal into an audio signal and outputs the audio signal. In addition, the microphone 162 converts the collected audio signal into a signal. The audio frequency circuit 160 receives the signal, converts the signal into audio data, and then outputs the audio data to the RF circuit 108, to send the audio data to, for example, another mobile phone, or outputs the audio data to the memory 120 for further processing.

The I/O subsystem 170 is configured to control an input/output external device, and may include the other-input-device controller 171, a sensor controller 172, and a display controller 173. Optionally, one or more other-input-control-device controllers 171 receive a signal from the other input devices 130 and/or send a signal to the other input devices 130. The other input devices 130 may include a physical button (a push button, a rocker button, or the like), a dial, a slider switch, a joystick, a click scroll wheel, and an optical mouse (the optical mouse is an extension of a touch-sensitive surface that does not display a visual output, or an extension of a touch-sensitive surface formed by a touch-screen). It should be noted that the other-input-control-device controller 171 may be connected to any one or more of the foregoing devices. The display controller 173 in the I/O subsystem 170 receives a signal from the display screen 140 and/or sends a signal to the display screen 140. After the display screen 140 detects a user input, the display controller 173 converts the detected user input into an interaction with a user interface object displayed on the display screen 140, that is, realizes a man-machine interaction. The sensor controller 172 may receive a signal from one or more sensors 150 and/or send a signal to the one or more sensors 150.

The processor 180 is a control center of the mobile phone 100, connects various parts of the mobile phone by using various interfaces and lines, and performs various functions and data processing of the mobile phone 100 by running or executing the software program and/or the module stored in the memory 120 and invoking data stored in the memory 120, to perform overall monitoring on the mobile phone. Optionally, the processor 180 may include one or more processing units. Preferably, an application processor and a modem processor may be integrated into the processor 180. The application processor mainly processes an operating system, a user interface, an application program, and the like. The modem processor mainly processes radio communication. It can be understood that the modem processor may not be integrated into the processor 180.

The mobile phone 100 further includes the power supply 190 (such as a battery) that supplies power to the components. Preferably, the power supply may be logically connected to the processor 180 by using a power supply management system, so that functions such as charge, discharge, and power consumption management are implemented by using the power supply management system.

Although not shown, the mobile phone 100 may further include a camera, a Bluetooth module, and the like. Details are not described herein.

The terminal device 100 may dynamically adjust a working status of the components such as the processor 180 to optimize work efficiency. When system load is relatively low, for example, a relatively small quantity of memory and processor resources are occupied by a currently running program, the terminal device 100 sets the processor 180 to a low power consumption mode, to prolong a service life of the battery and reduce a temperature of the terminal device 100. When system load is relatively high, for example, when the user starts a system or opens an APP, the processor 180 may be set to a high power consumption mode. For example, operating power consumption is increased through overclocking or the like, to achieve higher performance, shorten a program starting time, and improve user experience. It may be understood that a working status of the processor 180 may also be implemented by starting or stopping the processor 180, or powering on or powering off the terminal device.

In a possible implementation, the sensor may be set for the terminal device 100 to monitor an outer surface temperature of the terminal device 100 and keep the outer surface temperature below a threshold, to provide good experience for the user. A time for which the processor 180 can be in the high power consumption mode may depend on the outer surface temperature of the terminal device 100.

For example, when the processor 180 is in the low power consumption mode, the processor 180 works at a power of 1 W, and the outer surface temperature of the terminal device 100 is 30° C. When the processor 180 is in the high power consumption mode, the processor 180 works at a power of 3 W. Ten seconds later, the outer surface temperature of the terminal device 100 rises to a threshold of 40° C. The processor 180 is then switched back to the low power consumption mode, that is, the processor 180 works at the power of 1 W It can be learned that a longer time for the outer surface temperature of the terminal device 100 to reach the threshold indicates a longer time of high performance output that can be provided by the processor 180, so that user experience can be optimized.

In a possible implementation, the processor 180 may be a heating element such as a CPU, a GPU, an FPGA, a baseband chip, or an MCU.

In a possible implementation, when the processor 180 works in the high power consumption mode, to effectively dissipate heat and prevent the processor 180 from being overheated and burned out, avoid bad user experience caused by an excessively high outer surface temperature of the terminal device 100, and extend a time for which the processor 180 can work in the high power consumption mode, in this embodiment of the present invention, a phase change material (PCM, Phase Change Material) with a predetermined phase change point and a predetermined heat capacity is used to dissipate heat for the processor 180.

Figure 3:
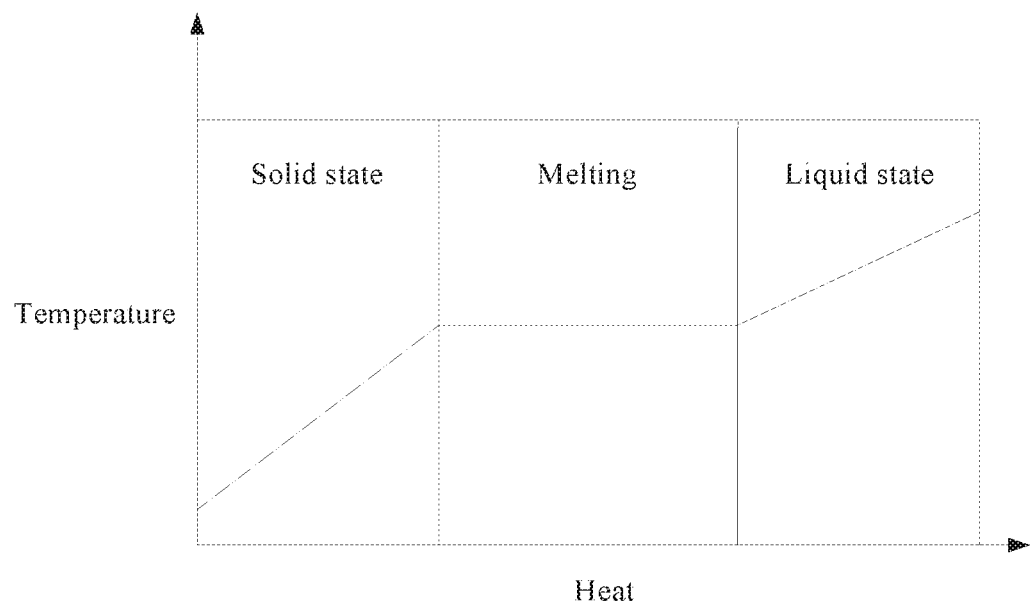
FIG. 3 is a line graph of heat absorption and temperature changes of a solid-liquid phase change material.

FIG. 3 is a line graph of heat absorption and temperature changes of a solid-liquid PCM material. The phase change material (PCM, Phase Change Material) is a substance that changes its shape with a temperature change and can provide latent heat. A process in which a phase change material changes between different states of being solid, liquid, and gaseous due to external condition changes, or a phase changes in a same existence state is referred to as a phase change process, and in this case, the phase change material absorbs or releases a large amount of latent heat. As shown in FIG. 3, a solid-liquid PCM material is used as an example.

A horizontal axis represents absorbed heat, and a vertical axis represents a temperature of the PCM material. The PCM material is initially solid, and the temperature is rising as heat is absorbed. When the temperature rises to a phase change point, the phase change begins, and latent heat is absorbed. In this case, the temperature of the PCM material keeps unchanged in a mixed solid-liquid state. After the entire phase change material becomes liquid, heat is absorbed, and the temperature of the PCM material continues to rise.

It can be learned that when the PCM material is in a phase change state, even if heat is continuously being absorbed, the temperature does not rise but remains at the phase change point. Therefore, a PCM material with a predetermined phase change point and a predetermined heat capacity may be used based on power consumption and an application scenario of the processor 180, so that within a particular period of time, the PCM material can remain, after absorbing heat dissipated by the processor 180 in the high power consumption mode, at a temperature that does not exceed the phase change point. On one hand, heat dissipated by the processor 180 can be effectively absorbed by the PCM material; on the other hand, an outer surface temperature of the terminal device 100 is controlled at a temperature that does not exceed the phase change point, avoiding overheating and providing good experience for a user. Heat absorbed by the PCM material may be dissipated directly into the air or dissipated into the air by using another heat dissipation structure.

It is worth mentioning that even though the temperature of the PCM material continues to rise after the phase change is completed, a time for which the processor 180 can work in the high power consumption mode is prolonged, providing good user experience.

In addition, a heat transfer unit itself may function to dissipate heat to an external environment, in addition to conducting heat from the processor 180 to the PCM material. After the processor 180 is switched from the high power consumption mode to the low power consumption mode, heat dissipated by the processor 180 is reduced, the temperature is lowered, heat absorbed by the PCM material can be dissipated into the air faster by using the heat transfer unit, and a reverse phase change occurs, so that a capability to absorb heat is recovered.

It is worth mentioning that FIG. 3 shows a line graph of ideal heat absorption and temperature changes of a solid-liquid PCM material. According to this embodiment of the present invention, the temperature may rise to some extent, for example, to 40° C. to 45° C., at a melting stage, because the PCM material has impurities, is unevenly heated, is a mixture, or the like. In view of this, in this embodiment of the present invention, a highest temperature of the PCM material at the melting stage is defined as the temperature at the phase change point, and the PCM material remains at a temperature substantially around the phase change point at the melting stage, and can still function to slow down an outer surface temperature rise of the terminal device 100.

In a possible implementation, the heat transfer unit may be an existing heat dissipation structure to facilitate reconstruction and reduce costs.

For example, when the processor 180 works in the low power consumption mode, it takes 10 s to open an Excel document; when the processor 180 works in the high power consumption mode, it takes only 5 s to open the same Excel document. If the outer surface temperature of the terminal device 100 reaches the threshold in 3 s, the processor 180 either switches back to the low power consumption mode, increasing the time to open the document; or continues to work in the high power consumption mode, causing the outer surface temperature of the terminal device 100 to be higher than the threshold, and bringing bad experience to the user. In this embodiment of the present invention, a large amount of heat dissipated by the processor 180 in the high power consumption mode is absorbed by the provided PCM material with the predetermined phase change point and the predetermined heat capacity, that is, the provided PCM material with a predetermined use amount, so that the temperature of the PCM material does not exceed the phase change point yet after the processor 180 works for 5 s in the high power consumption mode, and the outer surface temperature of the terminal device 100 is lower than the threshold, providing good experience for the user.

In a possible implementation, the phase change point of the PCM material ranges from 10° C. to 70° C. so that the PCM material can be used in a normal living environment of the user.

Further, the phase change point of the PCM material ranges from 30° C. to 45° C. to balance a heat capacity and a temperature.

In a possible implementation, a heat capacity of the PCM material ranges from 100 joules to 10000 joules, to balance the heat capacity and an occupied volume.

In a possible implementation, the heat capacity of the PCM material ranges from 1 g to 200 g, to balance the heat capacity and the occupied volume.

In a possible implementation, the heat capacity of the PCM material is calculated according to the following formula:

$$Q=W*t=H*m,$$

where Q indicates absorbed or released heat, that is, a heat capacity;

W indicates power consumption when heat passes through the PCM material;

t indicates a time required for absorbing heat continuously;

H indicates a latent heat value for a phase change of the PCM material; and m indicates required quality of the PCM material.

For example, if the PCM material has an enthalpy value of 145 J/g, the PCM material is designed to absorb 10 W heat, and the processor 180 needs to keep dissipating heat for 3 minutes (that is, the PCM material needs to keep absorbing heat for 3 minutes), the PCM material is required to be 10*3*60/145=12.4 g.

In a possible implementation, the PCM material only needs to meet a demand, and a shape and a size may be set based on a specific requirement.

In a possible implementation, the use amount of the PCM material is determined based on a use scenario of the terminal device 100 in the high power consumption mode. For example, it takes one minute to power on the terminal device 100, and heat dissipated by the processor 180 is 2000 J. For example, it takes 5 seconds for the user to open an APP, and heat dissipated by the processor 180 is 200 J. For example, if the user runs a game Angry Birds for one hour, the terminal device 100 dissipates extra heat of 3000 J in addition to normal heat dissipation when the game is not run.

In a possible implementation, the use amount of the PCM material may be determined based on a use frequency and/or a use habit of the user, for example, determined by determining, based on a user habit or big data, accumulated heat dissipated by the processor 180 in the high power consumption in a scenario in which the user opens a plurality of APPs successively within a short time.

In a possible implementation, the use amount of the PCM material may be set based on a heat capacity that is higher than an amount of dissipated heat in all use scenarios in high power consumption, so that the temperature of the PCM material never exceeds the phase change point. Alternatively, in some scenarios, the temperature of the PCM material is allowed to be higher than the phase change point, but a time for which the processor 180 can work in the high power consumption mode can still be extended, to achieve a balance between a heat dissipation effect and cost reduction.

In an implementation of the present invention, various existing PCM materials may be used. Common PCM materials are described as follows.

There are many types of phase change materials. In terms of chemical composition, the phase change material may be classified into three major categories: an inorganic material, an organic material, and a composite phase change material. In terms of a temperature range of energy storage, the phase change material may be classified into types such as a high-temperature phase change material, a medium-temperature phase change material, and a low-temperature phase change material. In terms of material phase changes in an energy storage process, the phase change material may be classified into a solid-liquid phase change energy storage material, a solid-solid phase change energy storage material, a solid-gas phase change energy storage material, a liquid-liquid phase change energy storage material, and a liquid-gas phase change energy storage material.

1. Inorganic Phase Change Material

The inorganic phase change material mainly includes metal alloy (Mg—Cu), metal salt hydrate (Na2SO4.4H2O and MgCl.6H2O), alkali metal hydrate, activated clay, mineral wool, and the like. A phase change mechanism is as follows: When the material is heated, crystal water is removed to absorb heat; on the contrary, water is absorbed, and heat is released. The material has a high phase change temperature and a large heat storage capacity, and is applied to a high-temperature heat environment.

TABLE 2

Parameters of solid-liquid phase change materials

| Name | Phase change temperature/° C. | Enthalpy variable/J · g$^{-1}$ |
|---|---|---|
| Paraffin $C_{14}$ | 4.5 | 165 |
| Paraffin $C_{15}$-$C_{16}$ | 8 | 153 |
| Paraffin $C_{16}$-$C_{18}$ | 20-22 | 152 |
| Pataffin $C_{13}$-$C_{24}$ | 22-24 | 189 |
| Paraffin $C_{18}$ | 28 | 244 |
| Propyl palmitate | 10 | 186 |
| isopropyl palmitate | 11 | 95-100 |
| Isopropyl stearate | 14-18 | 140-142 |
| Capiylic acid | 16.3 | 148 |
| Butyl stearate | 19 | 140 |
| Ethylene butyl ester | 44.1 | 116.5 |
| 1-Dodecanol | 26 | 200 |
| 1-Tetradecanol | 38 | 205 |
| Neopentyl glycol | 27-29 | 155 |
| 2-Amino-2-Methyl1-1,3-Propylene glycol | 57 | 114.1 |
| Hexadecane | 16.7 | 236.6 |
| Octadecane | 28.2 | 242.2 |
| Eicosane | 36.6 | 246.6 |
| Capric acid | 31 | 172 |
| Lauric acid | 41-48 | 200 |
| Myristic acid | 57-54 | 228 |
| Tetradeconic acid | 52.1 | 190.0 |
| Palmitic acid | 54.1 | 183.0 |
| Neopentyl glycol | 43.0 | 130.0 |
| 12-Hydroxyl-Methyl stearate | 42-43 | 120-126 |

A solid-solid phase change material implements an energy storage and release process mainly through transformation of crystal from an ordered structure to a disordered structure, and mainly includes polyalcohol, crosslinked polyethylene, and layered zinc-calcium ore. There is no macrostate change during a phase change process of the solid-solid phase change material.

3. Composite Phase Change Material

The composite phase change material changes from a liquid to a solid or from a solid to a liquid during a phase change, and easily interacts with another blended material. Solutions mainly include: (1) preparing a microcapsule; (2) preparing a shaped PCM; (3) preparing a nanocomposite PCM; and (4) preparing a porous composite PCM.

(1) Microcapsule Technology

The microcapsule technology is a technology of using a film-forming material to encapsulate a solid or a liquid to form a tiny particle with a core-shell structure (with a particle size of 2 μm to 1000 μm and a shell thickness of usually 0.2 μm to 10 μm). Main microcapsule preparation

TABLE 1

Parameters of common inorganic phase change materials

| Number | Phase change material | Phase change temperature of a raw material (° C.) | Phase change latent heat of a raw material (kJ/kg) | Solid density of a raw material (g/cm$^3$) | Specific heat of a solid raw material (J/gk) | Thermal conductivity coefficient of a raw material (W/mK) | Phase change material content in a composite phase change part | Density range of a composite phase change part | Thermal conductivity coefficient of a composite phase change part in an ambient temperature | Specific heat capacity of a composite phase change part (J/g·K) |
|---|---|---|---|---|---|---|---|---|---|---|
| 1 | LiF | 848 | 1044 | 2.64 | 3.86 | 1.92 | 70%-75% | 0.9-1.0 | 0.29 | 1.9 |
| 2 | NaF | 995 | 789 | 2.8 | 2.67 | 1.51 | 80%-85% | 1.1-1.4 | 0.38 | 2.1 |
| 3 | MgF$_2$ | 1263 | 938 | 1.945 | | | 70%-75% | 0.9-1.0 | 0.24 | |

2. Organic Phase Change Material

A solid-liquid phase change and a solid-solid phase change of the organic phase change material have high application values and are widely studied. Widely applied solid-liquid phase change materials include ethyl palmitate, butyl stearate, dodecanoic acid, short-ring acid, goat acid, paraffin, dodecanol, tetradecanoyl, butyl stearic acid, and the like.

methods include an interfacial polymerization method and an in-situ polymerization method.

There are many studies in preparing a microcapsule by using the in-situ polymerization method, and a shell layer of a commonly used paraffin microcapsule includes melamine formaldehyde resin, urea formaldehyde resin, polyurethane, polypropylene, phenolic resin, and the like.

The interfacial polymerization method features a fast reaction speed, a mild reaction condition, a low requirement for purity of a reaction monomer, a relaxed raw material ratio, a relatively high wall permeability, and low costs.

(2) Shaped PCM

The shaped PCM is a PCM formed by paraffin dispersed on a base of a polymer material. Paraffin and high molecular polymer (polyethylene, ethylene-vinyl acetate copolymer, ethylene propylene rubber, and the like) are melt-blended, and paraffin is evenly dispersed in the cured high molecular polymer. Polyethylene is a common matrix-coated material, and paraffin leakage is usually prevented through crosslinking and grafting.

(3) Nanocomposite PCM

Nanoscale or metal oxide particles are added to a base liquid in a particular manner and at a particular ratio to prepare the nanocomposite PCM. The nanocomposite PCM can be applied to innovative research in the field of thermal energy engineering.

(4) Porous Composite PCM

For an inorganic porous material (attapulgite, proteinaceous soil, expanded graphite, bentonite, perlite, or the like), an organic PCM is absorbed by using methods such as vacuum adsorption, a percolation method, a melt intercalation method, and a blending method, to control the PCM to change a phase in a particular space range, to prepare a porous paraffin PCM with a stable phase change temperature and phase change enthalpy.

In a possible implementation, the PCM material includes a solid-solid phase change material or a solid-liquid phase change material. The solid-solid phase change material or the solid-liquid phase change material can maintain a shape and a volume substantially unchanged during a phase change, and can be applied to a terminal device, so that installation and use processes become more reliable, and another element of the terminal device is not crushed or damaged due to a volume change during the phase change of the PCM material.

In another possible implementation, the PCM material includes a solid-gas phase change material or a liquid-gas phase change material, and has a housing of sufficient strength to keep a shape and a volume of the PCM material substantially unchanged during a phase change.

In a possible implementation, a plurality of phase change materials may be mixed to obtain a designed heat capacity and a designed phase change point. A person skilled in the art can obtain a ratio through a limited quantity of experiments without creative efforts.

In a possible implementation, the PCM material may include a composite phase change material.

Further, in a possible implementation, a form of the composite phase change material includes a microcapsule, a shaped PCM, a nanocomposite PCM, or a porous composite PCM.

Figure 4:
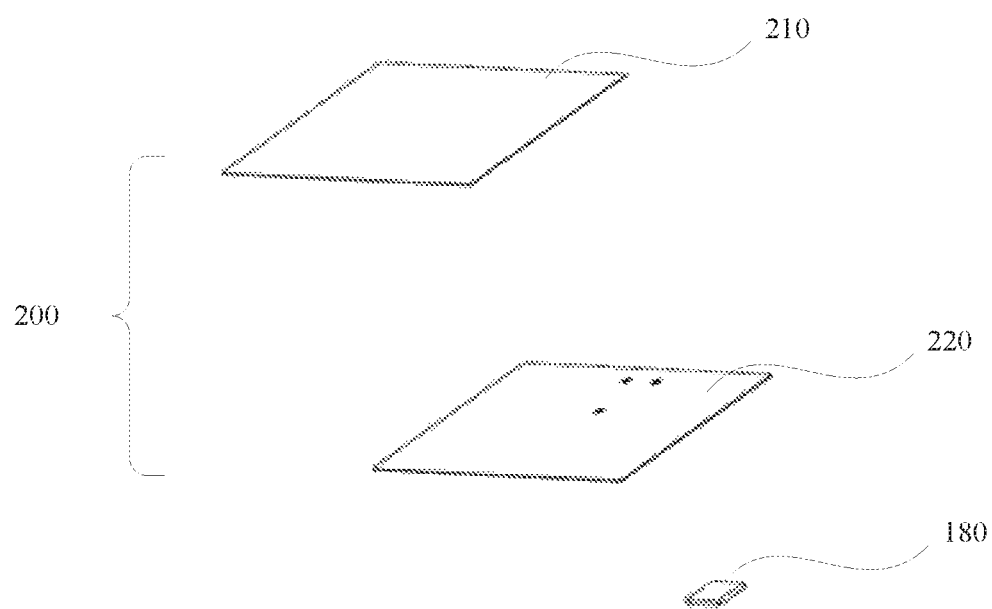
FIG. 4 is a schematic diagram of a heat dissipation apparatus according to a possible implementation of the present invention.
Figure 5:
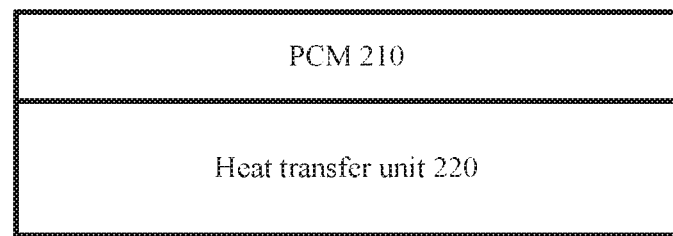
FIG. 5 is a schematic structural diagram of the heat dissipation apparatus in FIG. 4.

FIG. 4 is a schematic diagram of a heat dissipation apparatus according to a possible implementation of the present invention. FIG. 5 is a schematic structural diagram of the heat dissipation apparatus in FIG. 4. As shown in FIG. 4 and FIG. 5, a heat dissipation apparatus 200 is in contact with a processor 180 to absorb heat dissipated by the processor 180 and then dissipate the heat into the air or conduct the heat to another heat dissipation element.

In a possible implementation, the heat dissipation apparatus 200 includes a PCM material 210 and a heat transfer unit 220. The heat transfer unit 220 is configured to be in direct contact with the processor 180, and the PCM material 210 is in contact with the heat transfer unit 220.

In a possible implementation, the PCM material 210 and the heat transfer unit 220 are connected through bonding or mechanical fastening to prevent falling-off in use.

In a possible implementation, the heat transfer unit 220 is made from a material with a good heat transfer coefficient, for example, a metal material such as gold, silver, copper, iron, or aluminum, or a non-metal material such as graphite, or another composite material with a good heat transfer coefficient. The heat transfer unit 220 may be made from one or more materials.

In a possible implementation, the PCM material 210 covers the entire heat transfer unit 220, so that a thickness of the PCM material 210 can be reduced, and an interior of a terminal device 100 becomes more compact.

In a possible implementation, when the processor 180 switches from a high power consumption mode to a low power consumption mode, the heat transfer unit 220 is configured to dissipate heat absorbed by the PCM material 210 into the air, or conduct heat to another heat dissipation element.

Figure 6:
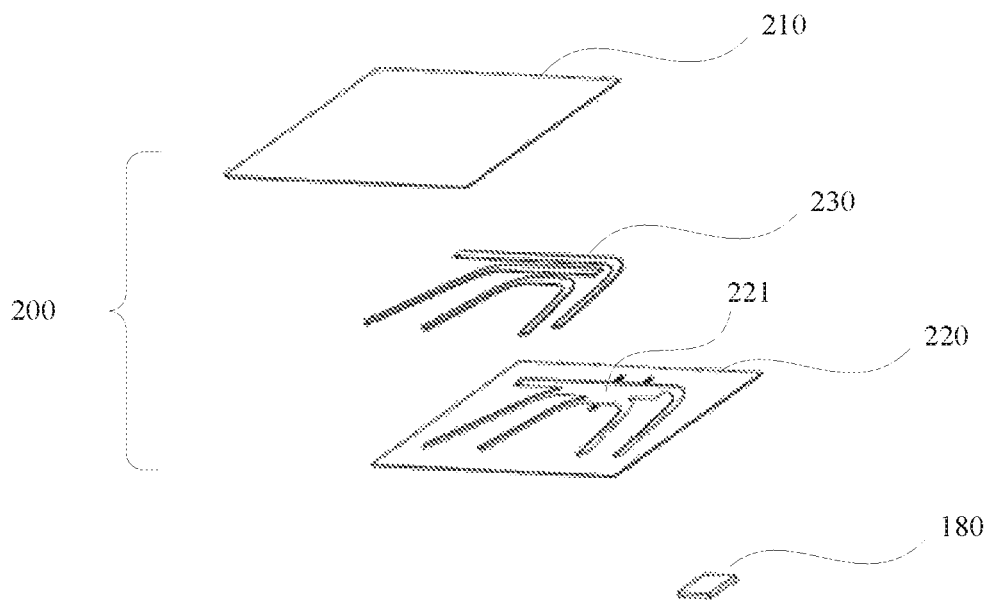
FIG. 6 is a schematic diagram of a heat dissipation apparatus according to another possible implementation of the present invention.
Figure 7:
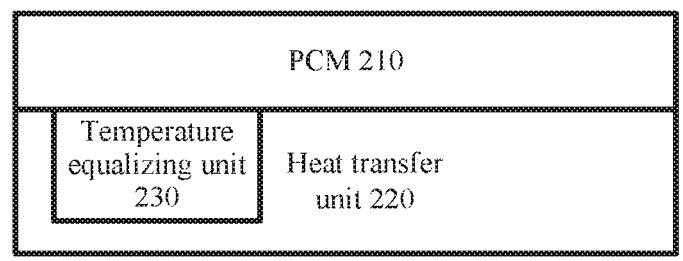
FIG. 7 is a schematic structural diagram of the heat dissipation apparatus in FIG. 6.

FIG. 6 is a schematic diagram of a heat dissipation apparatus according to another possible implementation of the present invention. FIG. 7 is a schematic structural diagram of the heat dissipation apparatus in FIG. 6. As shown in FIG. 6 and FIG. 7, the heat dissipation apparatus 200 further includes a temperature equalizing unit 230. The temperature equalizing unit 230 is disposed between a PCM material 210 and a heat transfer unit 220, and is configured to conduct heat on the heat transfer unit 220 more evenly to the PCM material 210 to improve heat dissipation efficiency. In this embodiment of the present invention, one or a combination of the temperature equalizing unit 230 and the heat transfer unit 220 may be referred to as a temperature equalizing module.

In a possible implementation, the heat transfer unit 220 may be provided with a groove 221 matching a shape of the temperature equalizing unit 230, and the temperature equalizing unit 230 is disposed in the groove 221, to reduce a thickness of the heat dissipation apparatus 200.

In a possible implementation, the temperature equalizing unit 230 may be a heat pipe or a VC (Vapor Chamber, through which heat is quickly conducted by using evaporated latent heat and condensed latent heat of a liquid). Heat is conducted from a processor 180 to an area in which the heat transfer unit 220 is in contact with the processor 180, and then heat is diffused to the entire heat transfer unit 220 by using the temperature equalizing unit 230 such as the heat pipe or the VC. In a possible implementation, the temperature equalizing unit 230 makes a temperature difference between any two points of the entire heat transfer unit 220 less than 5° C., and then the PCM material 210 absorbs heat from a surface of the heat transfer unit 220 and stores the heat, to prolong a time for a surface temperature of the terminal device 100 to reach a phase change point, so that the processor 180 obtains as longer high-performance working time as possible.

In a possible implementation, the heat pipe may be a heat conductive metal pipe such as a copper pipe or an aluminum pipe.

In a possible implementation, the VC is a hollow sealed metal pipe such as a copper pipe or an aluminum pipe. A small amount of PCM material, usually 0.01 g to 0.1 g, is sealed inside the VC. Due to the small use amount, a heat capacity of the PCM material inside the VC is quite low, a surface temperature of the VC is far higher than a phase change point of the PCM material inside the VC, and the PCM material is merely used to accelerate heat transfer of the VC, but not used to store heat.

Further, in a possible implementation, the PCM material inside the VC includes a solid-gas phase change material or a liquid-gas phase change material, and has a metal housing of sufficient strength to keep a shape and a volume of the PCM material substantially unchanged during a phase change.

Figure 8:
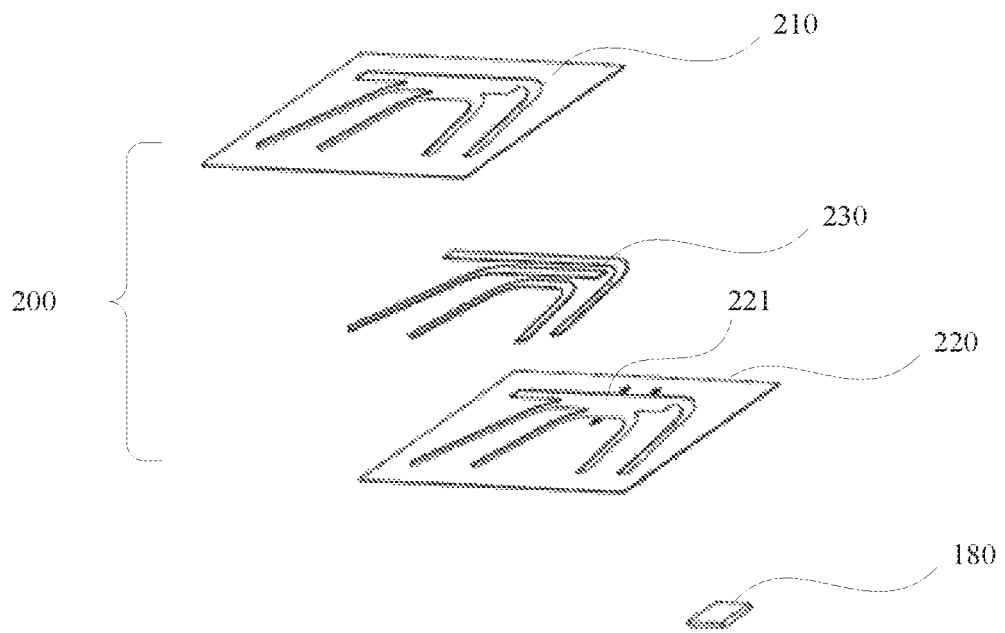
FIG. 8 is a schematic diagram of a heat dissipation apparatus according to still another possible implementation of the present invention.
Figure 9:
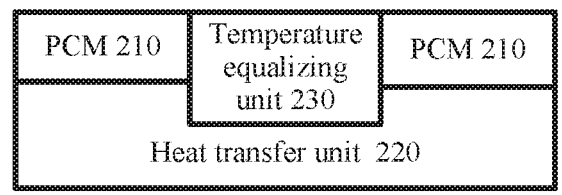
FIG. 9 is a schematic structural diagram of the heat dissipation apparatus in FIG. 8.

FIG. 8 is a schematic diagram of a heat dissipation apparatus according to still another possible implementation of the present invention. FIG. 9 is a schematic structural diagram of the heat dissipation apparatus in FIG. 8. As shown in FIG. 8 and FIG. 9, unlike the implementation shown in FIG. 6, a material in an overlapping area between a PCM material 210 and a temperature equalizing unit 230 is removed, there is a gap matching a shape of the temperature equalizing unit 230, and the temperature equalizing unit 230 is disposed in the gap. Therefore, a thickness of a heat dissipation apparatus 200 is only equal to a thickness of a combination of the temperature equalizing unit 230 and a heat transfer unit 220. In this implementation, the PCM material 210 improves efficiency of the heat dissipation apparatus 200 without increasing the thickness of the heat dissipation apparatus 200.

In the foregoing possible implementations, positions of the PCM material 210, the heat transfer unit 220, and the temperature equalizing unit 230 may be flexibly adjusted. For example, the PCM material 210 or the temperature equalizing unit 230 may be in direct contact with the processor 180.

Figure 10:
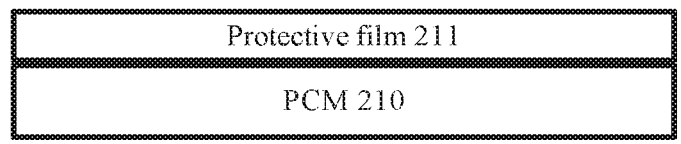
FIG. 10 is a schematic structural diagram of a PCM material according to a possible implementation of the present invention.

FIG. 10 is a schematic structural diagram of a PCM material according to a possible implementation of the present invention. As shown in FIG. 10, the PCM material 210 has a protective film 211, configured to maintain a shape of the PCM material 210 and provide protection for the CM material 210 during production.

In a possible implementation, the protective film 211 may be an organic thin-film such as PET or PI, or a metal thin-film. Further, a thickness is approximately 5% to 15% of a total thickness, and may be adjusted based on a requirement.

Figure 11:
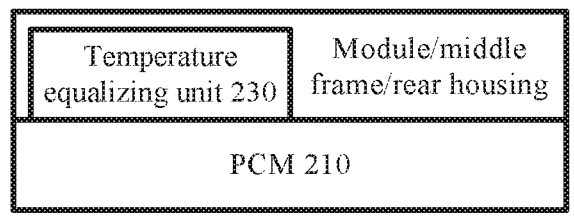
FIG. 11 is a schematic structural diagram of a heat dissipation apparatus according to still another possible implementation of the present invention.

FIG. 11 is a schematic structural diagram of a heat dissipation apparatus according to still another possible implementation of the present invention. As shown in FIG. 11, for a low-power-consumption tablet computer or mobile phone product, or a terminal device with a metal housing, a PCM material 210 may be directly attached to a middle frame or a rear housing of the tablet computer or the mobile phone, or may be disposed on another module such as a heat transfer unit. In this implementation, a structure of the terminal device such as a tablet computer or a mobile phone becomes more compact, and application of the PCM material 210 can directly lower an outer surface temperature of the tablet computer or mobile phone product without changing an existing heat dissipation structure.

In a possible implementation, a temperature equalizing unit 230 such as a heat pipe or a VC may be embedded into the heat transfer unit, the middle frame, or the housing to equalize heat.

In a possible implementation, if the middle frame or the housing is too thin to embed a heat pipe or a VC, a layer of material with a high thermal conductivity coefficient, such as graphite and copper foil, may be added on the PCM material 210 as a soaking layer to provide a function of the temperature equalizing unit 230 and improve temperature uniformity. The soaking layer may be outside the PCM material 210 or between the PCM material 210 and the housing.

Figure 12:
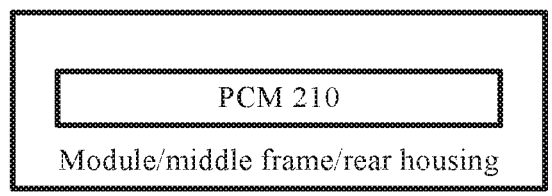
FIG. 12 is a schematic structural diagram of a heat dissipation apparatus according to still another possible implementation of the present invention.

FIG. 12 is a schematic structural diagram of a heat dissipation apparatus according to still another possible implementation of the present invention. As shown in FIG. 12, a module/middle frame/housing includes a cavity, and a PCM material 210 is filled in the cavity without changing an internal structure of a terminal device 100. This facilitates production and reduces costs.

In a possible implementation, when the PCM material 210 changes a phase, a volume does not change much, stress is relatively small, and a material with particular strength may be used for the module/middle frame/housing, or some space may be reserved, to ensure that when the PCM material 210 changes the phase, an appearance of the terminal device is not affected, or the module/middle frame/housing is not damaged.

Figure 13:
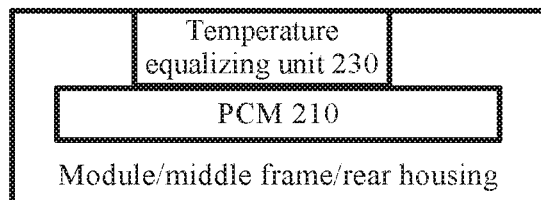
FIG. 13 is a schematic structural diagram of a heat dissipation apparatus according to still another possible implementation of the present invention.

FIG. 13 is a schematic structural diagram of a heat dissipation apparatus according to still another possible implementation of the present invention. As shown in FIG. 13, a temperature equalizing unit 230 such as a heat pipe or a heat equalizing layer with high thermal conductivity may be disposed in a module/middle frame/housing, so that the temperature equalizing unit 230 is in contact with a PCM material 210 to improve temperature uniformity.

Figure 14:
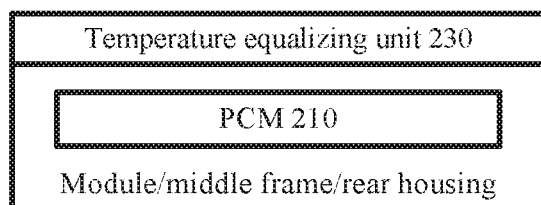
FIG. 14 is a schematic structural diagram of a heat dissipation apparatus according to still another possible implementation of the present invention.

FIG. 14 is a schematic structural diagram of a heat dissipation apparatus according to still another possible implementation of the present invention. As shown in FIG. 14, a temperature equalizing unit 230 may alternatively be disposed outside a module/middle frame/housing without being in direct contact with a PCM material 210, to improve temperature uniformity and reduce a housing thickness.

Figure 15:
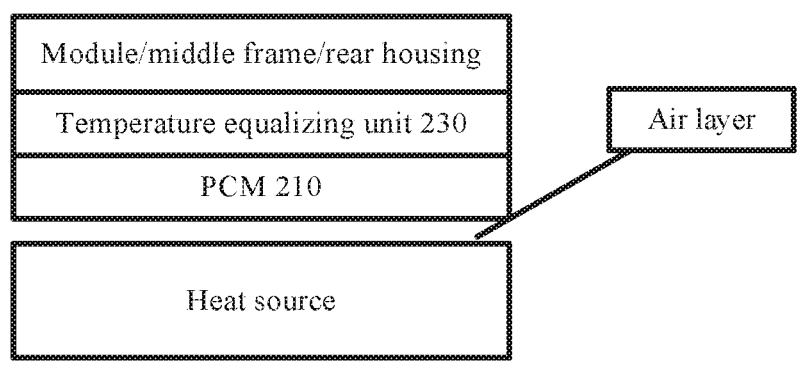
FIG. 15 is a schematic structural diagram of a heat dissipation apparatus according to still another possible implementation of the present invention.

FIG. 15 is a schematic structural diagram of a heat dissipation apparatus according to still another possible implementation of the present invention. As shown in FIG. 15, a PCM material 210 is not in direct contact with a heat source such as a processor 180, but an air layer is provided to equalize heat first. In this implementation, the air layer makes a temperature of the PCM material 210 more even.

Figure 16:
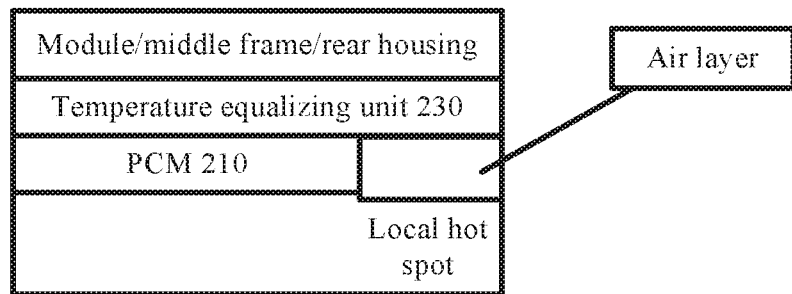
FIG. 16 is a schematic structural diagram of a heat dissipation apparatus according to still another possible implementation of the present invention.

FIG. 16 is a schematic structural diagram of a heat dissipation apparatus according to still another possible implementation of the present invention. As shown in FIG. 16, there is a local hot spot in a terminal device, and a PCM material 210 may not be disposed at the local hot spot, but an air layer is provided to equalize heat first. In this implementation, the air layer makes a temperature of the PCM material 210 more even, and as much space as possible may be used to dispose the PCM material 210.

Figure 17:
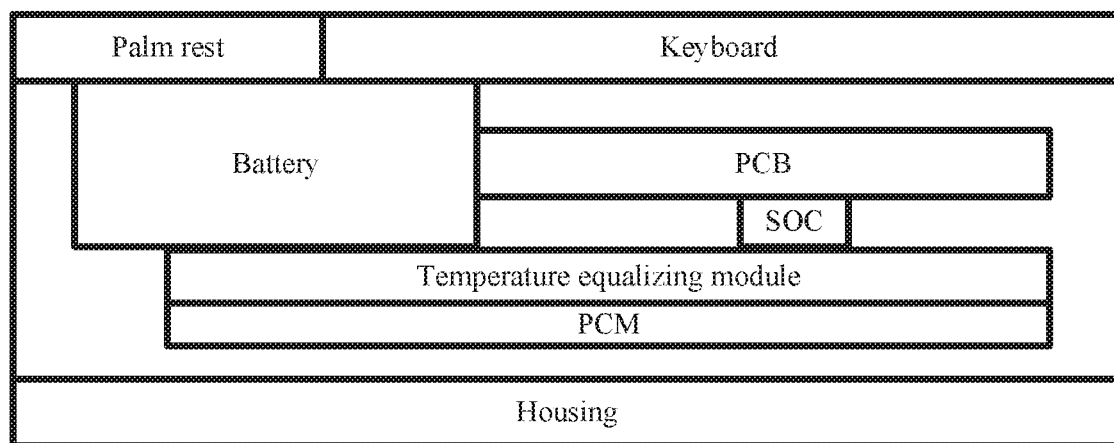
FIG. 17 is a schematic structural diagram of a terminal device according to a possible implementation of the present invention.

FIG. 17 is a schematic structural diagram of a terminal device according to a possible implementation of the present invention. A PCM material 210 may be disposed at a position outside a heat dissipation structure and near a housing, to facilitate addition of the PCM material 210 to the existing heat dissipation structure.

Figure 18:
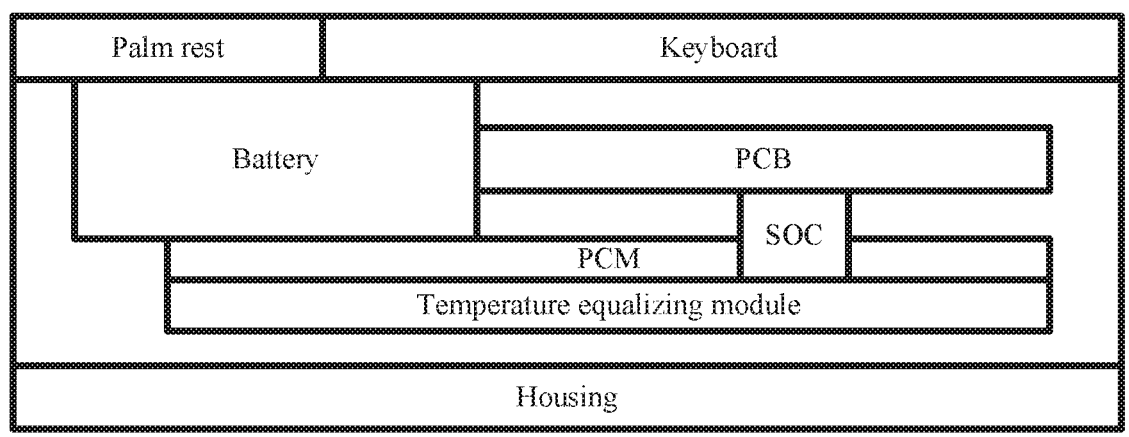
FIG. 18 is a schematic structural diagram of a terminal device according to another possible implementation of the present invention.

FIG. 18 is a schematic structural diagram of a terminal device according to another possible implementation of the present invention. A PCM material 210 may be disposed inside a heat dissipation structure, and a temperature equalizing module may be disposed between the PCM material 210 and a housing to make the heat dissipation structure compact.

Figure 19:
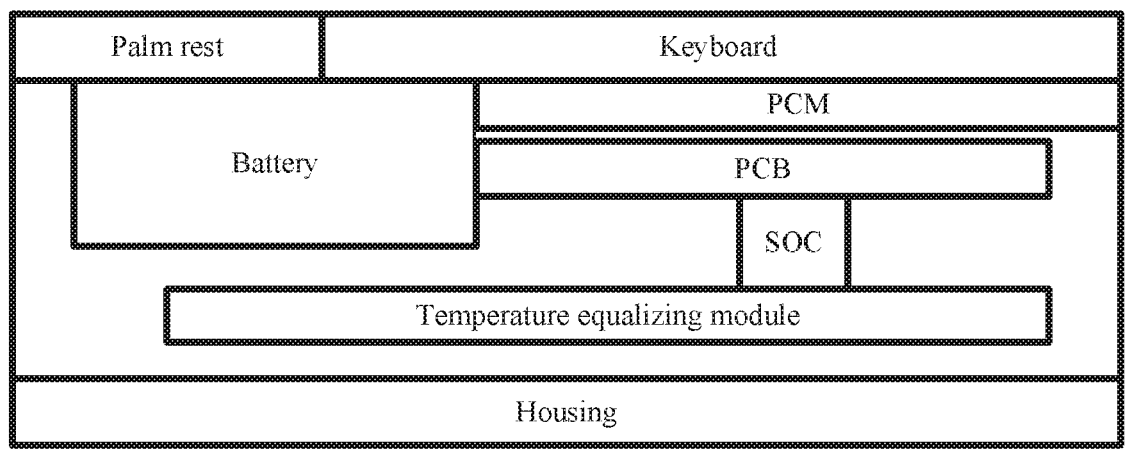
FIG. 19 is a schematic structural diagram of a terminal device according to still another possible implementation of the present invention.

FIG. 19 is a schematic structural diagram of a terminal device according to still another possible implementation of the present invention. A PCM material 210 is disposed at a position outside a heat dissipation structure and near a keyboard, to provide good experience for a user.

Figure 20:
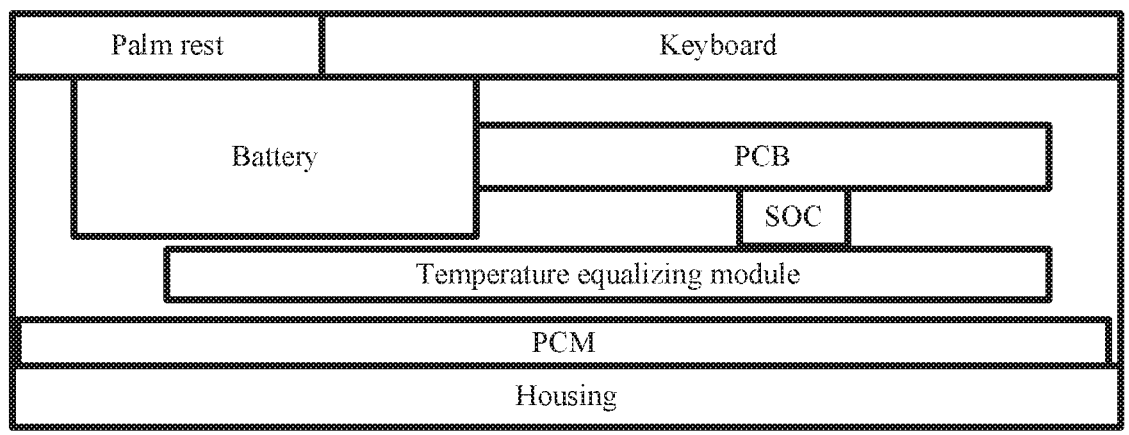
FIG. 20 is a schematic structural diagram of a terminal device according to still another possible implementation of the present invention.

FIG. 20 is a schematic structural diagram of a terminal device according to still another possible implementation of the present invention. A PCM material 210 may be disposed on a housing without being in direct contact with another heat dissipation structure, to facilitate production and manufacturing.

The embodiments of the present invention may achieve the following effects:

In a heat dissipation solution combining the PCM material and a heat equalizing module, there may be various combination forms. Examples are as follows:

The PCM material may be attached to a groove gap of a heat dissipation module without increasing a product thickness.

In addition to be attached to a module surface, the PCM material may be attached to a module rear face, attached to an inner wall of a housing of the device, attached to the back of a keyboard, or the like. The PCM may be attached to different areas at the same time based on a requirement.

In a low-power-consumption tablet computer or mobile phone, a heat transfer unit may not be required, and the PCM may be attached to a middle frame or a rear housing. A heat pipe may be used to equalize heat for the middle frame or the rear housing. If the heat pipe cannot be used, a heat equalizing layer may be added.

The PCM may also be embedded into the cavity in the module/middle frame/housing, and the heat pipe and the heat equalizing layer with high thermal conductivity may be used to improve temperature uniformity.

In the foregoing implementations, the PCM material 210 and/or the heat dissipation apparatus 200 may also dissipate heat for an element different from the processor 180, such as a memory, a battery, or a screen.

The foregoing implementations may be randomly combined to achieve different effects.

In summary, what is described above is merely example embodiments of the technical solutions of the present invention, but is not intended to limit the protection scope of the present invention. Any modification, equivalent replacement, or improvement made without departing from the principle of the present invention shall fall within the protection scope of the present invention.

What is claimed is:

1. A terminal device, comprising:
   a housing;
   a processor disposed inside the housing and configured to dynamically adjust a working mode;
   a phase change material disposed inside the housing and configured to absorb heat of the processor;
   a temperature equalizing unit that is disposed inside the housing and is in contact with the phase change material; and
   a heat transfer unit that is in contact with the processor and the phase change material and that conducts heat of the processor to the phase change material,
   wherein the phase change material comprises a gap,
   wherein the heat transfer unit comprises a groove, and
   wherein the temperature equalizing unit is disposed inside the gap and the groove.

2. The terminal device of claim 1, wherein a wall of the housing has a cavity, and wherein the phase change material is disposed in the cavity.

3. The terminal device of claim 1, wherein an air layer is disposed between the phase change material and the processor.

4. The terminal device of claim 1, wherein a phase change point of the phase change material ranges from 10 degrees Celsius (° C.) to 70° C.

5. The terminal device of claim 1, wherein a phase change point of the phase change material ranges from 30 degrees Celsius (° C.) to 45° C.

6. The terminal device of claim 1, wherein a heat capacity of the phase change material ranges from 100 joules to 10,000 joules.

7. The terminal device of claim 1, wherein a mass of the phase change material ranges from 1 grams (g) to 200 g.

8. The terminal device of claim 1, wherein the phase change material comprises a solid-solid phase change material.

9. The terminal device of claim 8, wherein the phase change material comprises a composite phase change material, and wherein a form of the composite phase change material comprises a microcapsule.

10. The terminal device of claim 1, wherein the phase change material comprises a solid-gas phase change material and has a housing of sufficient strength to keep a shape and a volume of the phase change material substantially unchanged during a phase change.

11. The terminal device of claim 1, wherein the heat transfer unit is provided with the groove matching a shape of the temperature equalizing unit, and wherein the temperature equalizing unit is disposed in the groove.

12. The terminal device of claim 1 wherein the gap of phase change material matches a shape of the temperature equalizing unit, and wherein the temperature equalizing unit is disposed in the gap.

13. The terminal device of claim 1, wherein the phase change material comprises a solid-liquid phase change material.

14. The terminal device of claim 8, wherein the phase change material comprises a composite phase change material, and wherein a form of the composite phase change material comprises a shaped phase change material.

15. The terminal device of claim 8, wherein the phase change material comprises a composite phase change material, and wherein a form of the composite phase change material comprises a nanocomposite phase change material.

16. The terminal device of claim 8, wherein the phase change material comprises a composite phase change material, and wherein a form of the composite phase change material comprises a porous composite phase change material.

17. The terminal device of claim 1, wherein the phase change material comprises a liquid-gas phase change material and has a housing of sufficient strength to keep a shape and a volume of the phase change material substantially unchanged during a phase change.

* * * * *